United States Patent [19]
Mohapatra et al.

[11] Patent Number: 5,990,749
[45] Date of Patent: Nov. 23, 1999

[54] DEVICE FOR POLE SPLITTING IN AMPLIFIERS

[75] Inventors: Subrat Mohapatra, San Jose; Edward Liu, Sunnyvale, both of Calif.

[73] Assignee: LSI Logic Corporation, Milpitas, Calif.

[21] Appl. No.: 08/987,858

[22] Filed: Dec. 9, 1997

[51] Int. Cl.⁶ .................................................... H03F 1/34
[52] U.S. Cl. .............................................. 330/294; 330/85
[58] Field of Search ................................. 330/85, 99, 100, 330/107, 260, 294

[56] References Cited

U.S. PATENT DOCUMENTS 5,828,264  10/1998  Koifman et al. ........................ 327/562
5,838,199  11/1998  Nakamura ................................ 330/258

*Primary Examiner*—Robert Pascal
*Assistant Examiner*—Henry Choe
*Attorney, Agent, or Firm*—Mitchell, Silberberg & Knupp LLP

[57] ABSTRACT

A novel device for pole splitting which can be employed in multistage amplifiers having a final stage and a prior stage. The device comprises a first capacitor connected between the output of the prior stage and the output of the final stage, a source follower, and a second capacitor connected between the output of the prior stage and the source follower. The source follower provides an offset voltage that reduces variation of the total capacitance of the first and second capacitors. In a preferred version of the present invention, the first and second capacitor each comprise a MOSFET transistor having a certain threshold voltage. The offset voltage is set to be at least the threshold voltage of the MOSFET transistors. In a preferred version, the source follower comprises a plurality of MOSFET transistors, which includes a MOSFET transistor having a gate connected to the first capacitor and a source connected to the second capacitor.

32 Claims, 1 Drawing Sheet

DEVICE FOR POLE SPLITTING IN AMPLIFIERS

BACKGROUND OF THE INVENTION

1. Field of the Invention

This invention relates to a device and method for pole splitting, which is typically used to increase the bandwidth and stability of amplifiers.

2. Description of the Related Art

The frequency response of amplifiers and other circuits is determined by a transfer function, which is completely specified in terms of its poles and zeros together with a multiplicative constant. The upper frequency response limit, or bandwidth, of an amplifier typically depends upon a dominant pole. Amplifier stability, that is, whether the amplifier will be subject to undesired oscillations, also depends upon the dominant pole.

One conventional method for frequency compensation to increase amplifier bandwidth and stability involves connecting a feedback capacitor to an output stage in the amplifier. This causes the pole formed at the input of the amplifier to shift to a lower frequency and thus become dominant, while the pole formed at the output of the amplifier is moved to a very high frequency and thus becomes unimportant. This shifting of poles is known as pole splitting.

Amplifiers are often components of integrated circuits (chips). Digital chip fabrication processes are often preferable to analog processes since digital processes are cheaper and can be developed faster. However, in digital processes it is difficult to create capacitors with high capacitance value in a small chip area. The conventional method of pole splitting using a feedback capacitor is typically implemented with poly capacitors, metal poly sandwiched capacitors, and other capacitor types, with relatively high capacitance value. These capacitors consume a very large, inefficient amount of chip area when fabricated with digital processes.

Sometimes a metal oxide semiconductor field effect transistor (MOSFET) is used as a feedback capacitor. The problem with this prior art scheme is that the capacitance of the MOSFET transistor varies widely with the input signal; the capacitance may drop to a value which is too low for effective frequency compensation. Additionally, an amplifier suffers from undesired oscillations when the compensation capacitance drops too low. What is needed is a pole splitting device which has low variation in compensation capacitance.

Therefore, objects of this invention include providing a device for pole splitting which has a high value of effective capacitance while using very little chip area, and low variation in compensation capacitance.

SUMMARY OF THE INVENTION

These objects are achieved by the present invention, which can be employed in multistage amplifiers comprising a final stage and a prior stage. The device comprises a first capacitor connected between the output of the prior stage and the output of the final stage, a source follower, and a second capacitor connected between the output of the prior stage and the source follower. The source follower provides an offset voltage such that variation of the total capacitance of the first and second capacitors is minimized.

In a preferred version of the present invention, the first and second capacitor each comprise a MOSFET transistor having a certain threshold voltage. The MOSFET transistors preferably are PMOS transistors, but could be NMOS. The offset voltage is set to be at least the threshold voltage of the MOSFET transistors. In a preferred version, the source follower comprises a plurality of MOSFET transistors, which includes a MOSFET transistor having a gate connected to the first capacitor and a drain connected to the second capacitor.

These and other aspects, features, and advantages of the present invention will be apparent to those persons having ordinary skill in the art to which the present invention relates from the foregoing description and the accompanying drawings.

DESCRIPTION OF THE PREFERRED EMBODIMENTS

Figure 1:
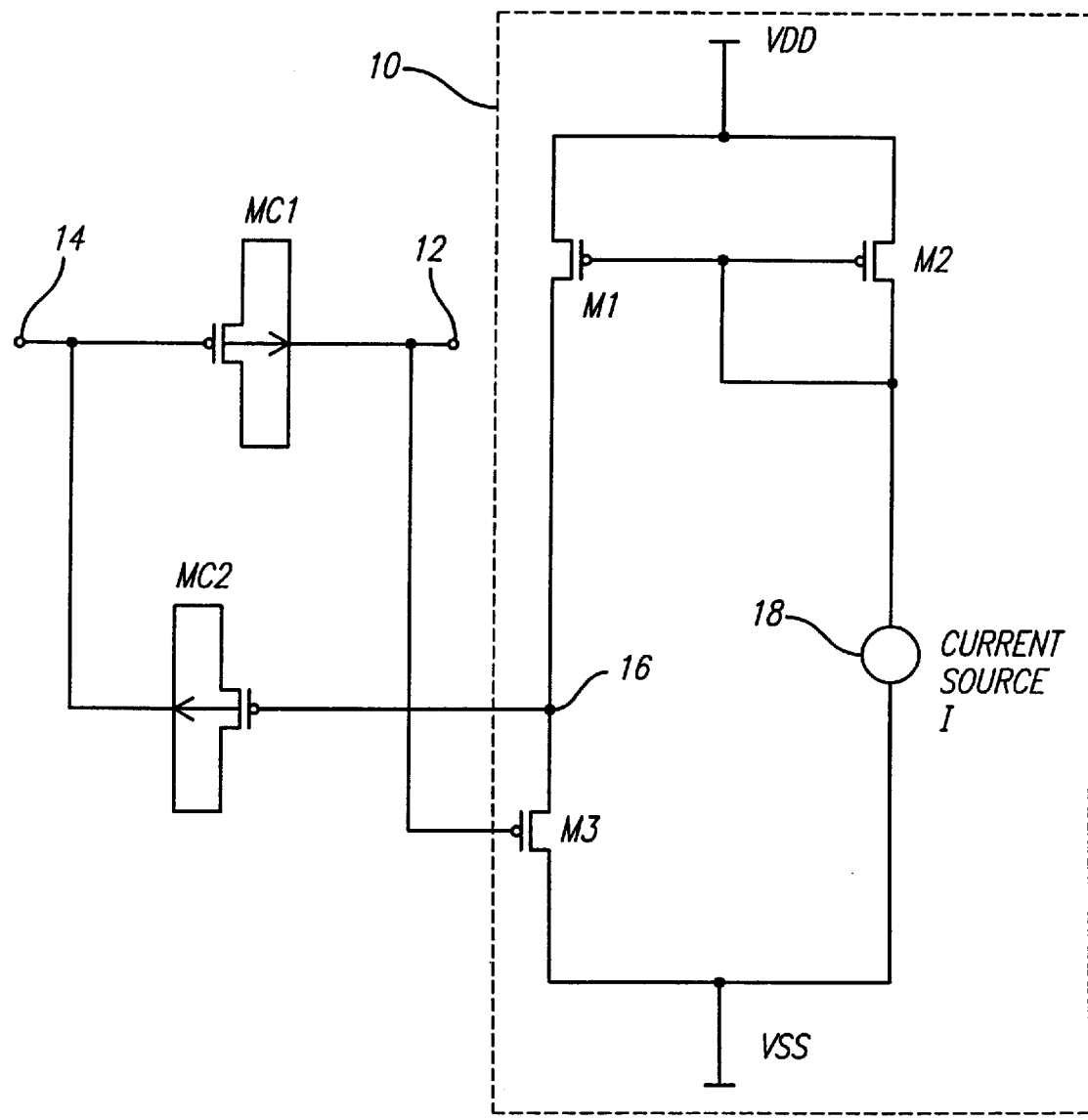
FIG. 1 is a schematic of a preferred embodiment of the present invention.

FIG. 1 shows a preferred embodiment of a device according to the present invention, which can be employed in multistage amplifiers comprising a final stage having an output node 12 and a prior stage having an output node 14. The device comprises a first capacitor MC1 connected between the prior stage output 14 and the final stage output 12, a source follower 10, and a second capacitor MC2 connected between the prior stage output 14 and the source follower 10.

The total effective capacitance between nodes 12 and 14 varies in response to variations in an input signal at node 14. In prior art devices this capacitance variation is relatively large, and the capacitance may drop to a value which is too low for effective frequency compensation. Amplifiers suffer from undesired oscillations when the compensation capacitance drops too low. These problems are solved by the source follower 10 of the present invention, which creates an offset in voltage between node 12 and node 16. This offset voltage reduces variation of the total capacitance of the first and second capacitors MC1, MC2, that is, the total effective capacitance between nodes 12 and 14. In a preferred version of the present invention, the first and second capacitors MC1, MC2 each comprise a MOSFET transistor having a certain threshold voltage. The MOSFET transistors preferably are PMOS transistors, but could be NMOS, which are typically slower and noisier when fabricated using digital processes (although they may be suitable when analog processes are used). The offset voltage is set to be at least the threshold voltage. No significant advantage is achieved by increasing the offset voltage beyond the threshold voltage; performance remains about constant. In a preferred version, the source follower 10 comprises a plurality of MOSFET transistors, M1–M3, which includes a MOSFET transistor M3 having a gate connected to the first capacitor MC1 and a source connected to the second capacitor MC2. Transistor M2 acts as a current mirror. An external current source 18 provides bias. As an alternative to MOSFET transistors, other types of field effect transistors, or bipolar junction transistors, might be used.

A device built according to a preferred version of the present invention achieved substantial savings in chip area, high effective capacitance, and greatly reduced variation in total capacitance. By way of example and not of limitation, the new device was built using a 0.35 micrometer digital process and PMOS transistors. The offset voltage was set at 0.6 volts, the threshold voltage of the MOSFET transistors. The new device consumed only about 10% of the area required by a typical prior art device. While the capacitance of a comparable prior art device varied from 52 pF to 9 pF as the input voltage varied rail to rail from 0 to 3 volts, the capacitance of the new device varied from 52 pF to 29 pF. Thus, while the prior art device capacitance dropped to about one-sixth of its original value, the capacitance of the new device embodying the present invention dropped by only about half.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶ 6.

What is claimed is:

1. A device for pole splitting in an amplifier, wherein the amplifier comprises a final stage having an output and a prior stage having an output, the device comprising:

a first capacitor connected between the output of the prior stage and the output of the final stage;
   a source follower; and
   a second capacitor connected between the output of the prior stage and the source follower,
      wherein the source follower provides an offset voltage such that variation of the total capacitance of the first and second capacitors is minimized.

2. The device of claim 1, wherein the first and second capacitor each comprise a MOSFET transistor having a threshold voltage.

3. The device of claim 2, wherein the MOSFET transistors comprise PMOS transistors.

4. The device of claim 2, wherein the offset voltage is set to be at least the threshold voltage.

5. The device of claim 1, wherein the source follower comprises a plurality of MOSFET transistors.

6. The device of claim 5, wherein the source follower comprises a MOSFET transistor having a gate connected to the first capacitor, and a source connected to the second capacitor.

7. The device of claim 1, wherein the amplifier comprises multiple stages.

8. A device for pole splitting in an amplifier, wherein the amplifier comprises a final stage having an output and a prior stage having an output, the device comprising:

a first capacitor connected between the output of the prior stage and the output of the final stage;
   a source follower; and
   a second capacitor connected between the output of the prior stage and the source follower,
      wherein the first and second capacitor each comprise a MOSFET transistor having a threshold voltage, and
      wherein the source follower provides an offset voltage such that variation of the total capacitance of the first and second capacitors is minimized, the offset voltage being set to at least the threshold voltage.

9. The device of claim 8, wherein the MOSFET transistors comprise PMOS transistors.

10. The device of claim 8, wherein the source follower comprises a plurality of MOSFET transistors.

11. The device of claim 10, wherein the source follower comprises a MOSFET transistor having a gate connected to the first capacitor, and a source connected to the second capacitor.

12. The device of claim 8, wherein the amplifier comprises multiple stages.

13. A device for pole splitting in an amplifier, wherein the amplifier comprises a final stage having an output and a prior stage having an output, the device comprising:

a first means for providing capacitance connected between the output of the prior stage and the output of the final stage;
   offset means for providing an offset voltage; and
   a second means for providing capacitance connected between the output of the prior stage and the offset means,
      wherein the offset means provides an offset voltage such that variation of the total capacitance of the first and second means for providing capacitance is minimized.

14. The device of claim 13, wherein the first and second means for providing capacitance each comprise a MOSFET transistor having a threshold voltage.

15. The device of claim 14, wherein the MOSFET transistors comprise PMOS transistors.

16. The device of claim 14, wherein the offset voltage is set to be at least the threshold voltage.

17. The device of claim 13, wherein the offset means comprises a source follower.

18. The device of claim 17, wherein the source follower comprises a plurality of MOSFET transistors.

19. The device of claim 18, wherein the source follower comprises a MOSFET transistor having a gate connected to a first capacitor, and a source connected to a second capacitor.

20. The device of claim 13, wherein the amplifier comprises multiple stages.

21. An amplifier comprising:

a prior stage having a first output;
   a final stage having a second output; and
   a pole splitting device operatively connected to said first output and said second output, said pole splitting device comprising:
      a first capacitor connected between said first output and said second output;
      a source follower; and
      a second capacitor connected between said first output and the source follower,
         wherein the source follower provides an offset voltage such that variation of the total capacitance of the first and second capacitors is minimized.

22. The device of claim 21, wherein the first and second capacitor each comprise a MOSFET transistor having a threshold voltage.

23. The device of claim 22, wherein the MOSFET transistors comprise PMOS transistors.

24. The device of claim 22, wherein the offset voltage is set to be at least the threshold voltage.

25. The device of claim 21, wherein the source follower comprises a plurality of MOSFET transistors.

26. The device of claim 25, wherein the source follower comprises a MOSFET transistor having a gate connected to the first capacitor, and a source connected to the second capacitor.

27. The device of claim 21, wherein the amplifier comprises multiple stages.

28. An amplifier comprising:

a prior stage having a first output;

a final stage having a second output; and a pole splitting device operatively connected to said first output and said second output, said pole splitting device comprising:

a first capacitor connected between said first output and said second output;

a source follower; and a second capacitor connected between said first output and the source follower, wherein the first and second capacitor each comprise a MOSFET transistor having a threshold voltage, and wherein the source follower provides an offset voltage such that variation of the total capacitance of the first and second capacitors is minimized, the offset voltage being set to at least the threshold voltage.

29. The device of claim 28, wherein the MOSFET transistors comprise PMOS transistors.

30. The device of claim 28, wherein the source follower comprises a plurality of MOSFET transistors.

31. The device of claim 30, wherein the source follower comprises a MOSFET transistor having a gate connected to the first capacitor, and a source connected to the second capacitor.

32. The device of claim 28, wherein the amplifier comprises multiple stages.

* * * * *